United States Patent [19]
Li

[11] Patent Number: 5,797,990
[45] Date of Patent: Aug. 25, 1998

[54] APPARATUS FOR DAMPING A CRYSTAL INGOT SUSPENSION IN A CZOCHRALSKI CRYSTAL PULLER

[75] Inventor: Zhixin Li, Hudson, N.H.

[73] Assignee: Ferrofluidics Corporation, Nashua, N.H.

[21] Appl. No.: 605,508

[22] Filed: Feb. 26, 1996

[51] Int. Cl.⁶ .................................................. C30B 35/00
[52] U.S. Cl. .......................... 117/208; 117/30; 117/32; 117/200; 117/216
[58] Field of Search ........................... 117/15, 30, 32, 117/200, 208, 917

[56] References Cited

U.S. PATENT DOCUMENTS

| | | | |
|---|---|---|---|
| 3,607,139 | 9/1971 | Hanks | 117/217 |
| 3,841,845 | 10/1974 | Keller | 117/917 |
| 5,009,865 | 4/1991 | Boden et al. | 117/15 |
| 5,571,320 | 11/1996 | Grimes et al. | 117/32 |

*Primary Examiner*—Felisa Garrett
*Attorney, Agent, or Firm*—Kudirka & Jobse, LLP

[57] ABSTRACT

Orbital oscillations of the crystal ingot suspended in a cable in a Czochralski crystal puller are damped by mechanically connecting a high-temperature conductor to the ingot and generating a magnetic field in the vicinity of the conductor. The magnetic field induces an eddy current in the conductor when the ingot moves. The eddy current then interacts with the magnetic field to damp motion of the ingot. In one embodiment, the magnetic field generator is moved as the ingot grows to maintain the magnetic field in the vicinity of the conductor. In another embodiment, the strength of the magnetic field is adjusted dependent on the amplitude of the oscillations to conserve power.

26 Claims, 7 Drawing Sheets

APPARATUS FOR DAMPING A CRYSTAL INGOT SUSPENSION IN A CZOCHRALSKI CRYSTAL PULLER

FIELD OF THE INVENTION

This invention relates generally to silicon crystal growing devices, and more particularly to a method and apparatus for reducing undesired orbital motion of a suspended crystal ingot within a Czochralski crystal grower.

BACKGROUND OF THE INVENTION

Current semiconductor technology uses silicon substrates as the basic building material for semiconductor components. Such semiconductor components include, among others, transistors, resistors, integrated circuits, and diodes. The silicon substrates are created by cutting a thin silicon wafer into pieces. The silicon wafer is, in turn, manufactured by cutting thin slices from a single silicon crystal. Single silicon crystals, however, are not readily available in nature in a size or form that can easily be sliced into wafers of appreciable size. Accordingly, a number of techniques and devices have been developed that produce large single crystals of silicon.

One device for producing such a single silicon crystal is known in the art as a "Czochralski Crystal Puller" (referred herein as "crystal puller"). This device is discussed in more detail in "Semiconductor Silicon Crystal Technology", by Fumio Shimura, Academic Press, Inc., San Diego, Calif. 1989, pp 121–146 which material is hereby incorporated by reference. In summary, the crystal puller comprises a crucible of molten silicon within a vacuum chamber. A seed crystal is suspended from a wire cable and vertically lowered into contact with the melted silicon to initiate crystal growth. The seed crystal is then slowly pulled upwards from the silicon by means of a hoist motor which pulls up on the wire cable. When the seed crystal is withdrawn at the proper rate, crystal growth continues at the molten silicon surface, with the result that an elongated single crystal is grown from the molten silicon melt. To insure cross-sectional uniformity, the seed is rotated about its longitudinal axis during the pulling process and the crucible holding the molten silicon may also be rotated during the process.

In order to avoid contaminants in the silicon melt and the crystal, the pulling process is carried out at a relatively high vacuum within the vacuum chamber. Since the vacuum chamber is large, a significant amount of time is consumed in evacuating the chamber and then degassing the chamber to reduce the remaining contaminants. Consequently, once the chamber has been pumped down, it is desirable to grow as large as crystal as is practical before the vacuum chamber must be broken down and "recharged" to reduce "down" time and increase the yield of the apparatus. In order to produce large crystals, the length of the seed crystal wire tends to be quite long (several meters) when the seed crystal is initially lowered into the melt so that a long crystal can be pulled out of the melt.

As a result of the dynamic characteristics of the rotating, suspended crystal on the end of the long wire, the growing crystal (called an "ingot") undesirably tends to "orbit" or move in a roughly circular pattern centered about its axis. This orbital motion has various consequences that tend to disrupt uniform crystal growth. First, the orbiting motion adversely affects conventional mechanisms used to measure and control crystal diameter which is an important quality indicator of the crystal. For example, crystal diameter is typically measured by forming a crystal image with a Charge-Coupled-Device (CCD) camera and measuring the image. The orbiting motion gives the camera an erroneous signal causing a measurement and control error. Secondly, the orbiting motion disturbs the growing condition and may affect the homogeneity of the structure and the crystal chemical content, which is also an important quality indicator of the crystal. In addition, if the amplitude of the motion becomes large enough, the ingot may forcibly contact the vacuum chamber wall causing a portion of the growing ingot to break off. If a portion of the ingot is broken, it is effectively destroyed for crystal growth purposes. In such a case, the chamber must be broken down and the crystal growth process must be started again. Further, the orbiting ingot may brush against the vacuum chamber wall and/or the crucible and dislodge contaminants which tend to fall into the molten silicon and contaminate the melt for crystal growth purposes. Again, the chamber must be broken down and the process started again.

Prior art mechanisms have been used to reduce the amplitude of the orbital motion of the suspended ingots. For example, many prior art devices utilize a mechanical dampening mechanism, such as stabilizing rods or pulleys, within the vacuum chamber which mechanisms contact the pulling wire and limit the amplitude of the orbital motion. The physical contact of these mechanisms with the wire, coupled with their continued exposure to the high temperatures within the chamber necessary to keep the silicon molten, tends to cause the mechanisms to wear rapidly, allowing particles to fall into the molten silicon and contaminate it.

It is therefore among the general objects of this invention to provide an improved method and apparatus that dampens the orbital motion of a suspended ingot within the vacuum chamber of a crystal puller without mechanically contacting the pulling wire or the ingot inside the vacuum chamber.

It is another object of the invention to efficiently dampen the orbital motion of a suspended ingot in a silicon crystal grower.

It is also an object of the invention to magnetically dampen the orbital motion of a suspended ingot in a silicon crystal grower.

SUMMARY OF THE INVENTION

The invention reduces the amplitude of any orbital motion of a suspended ingot within a vacuum chamber of a Czochralski Crystal Puller by electromagnetic damping. Specifically, a first magnetic field generator is positioned relative to the Czochralski vacuum chamber in order to generate a first magnetic field within the chamber. A second magnetic field generator is mounted near the ingot, for example, on the wire cable that suspends the ingot within the chamber and generates a second magnetic field. When the ingot begins to orbit, the second magnetic field generator orbits with it and the interaction of the two fields reduces or eliminates the motion of the conductor and the attached ingot.

In accordance with one embodiment, the second magnetic field generator is an electrical conductor mechanically attached to the ingot. When the conductor moves through the first magnetic field, an eddy current is induced within the conductor due to the motion of the conductor in the field. The eddy current, in turn, generates the second magnetic field which interacts with the first field in a well-known manner to provide the required damping. Accordingly, crystal growth is more uniform.

In accordance with one embodiment, the first magnetic field generator is arranged so that the first magnetic field is substantially axial or parallel to the puller wire. Although many magnetic field orientations can provide adequate damping, an axial field provides even damping in all directions in the orbiting plane and is relatively easy to generate.

In an alternative embodiment, the first magnetic field generator generates a first magnetic field only in the vicinity of the conductor. The first field generator is attached to a mechanism which longitudinally moves the first field generator as the ingot is pulled from the melt so that the conductor always remains within the strongest part of the generated first magnetic field.

In another embodiment, the first magnetic field generator is an electromagnet where the generated first field strength is controlled by varying the current applied to the electromagnet. The invention further includes a motion sensor which senses the amplitude of the conductor orbital motion and, via a current controller, controls the amplitude of the current passing through the electromagnetic. The strength of the resulting first magnetic field is thereby modulated in response to the amplitude of the orbital motion sensed by the motion sensor. Accordingly, this embodiment has the capability of using current only on an "as needed basis" and thus, saves energy and increases device efficiency.

BRIEF DESCRIPTION OF THE DRAWING

The foregoing and other objects and advantages will be appreciated more fully from the following further description thereof, with reference to the accompanying drawings wherein.

DETAILED DESCRIPTION OF THE PREFERRED EMBODIMENT

Figure 1:
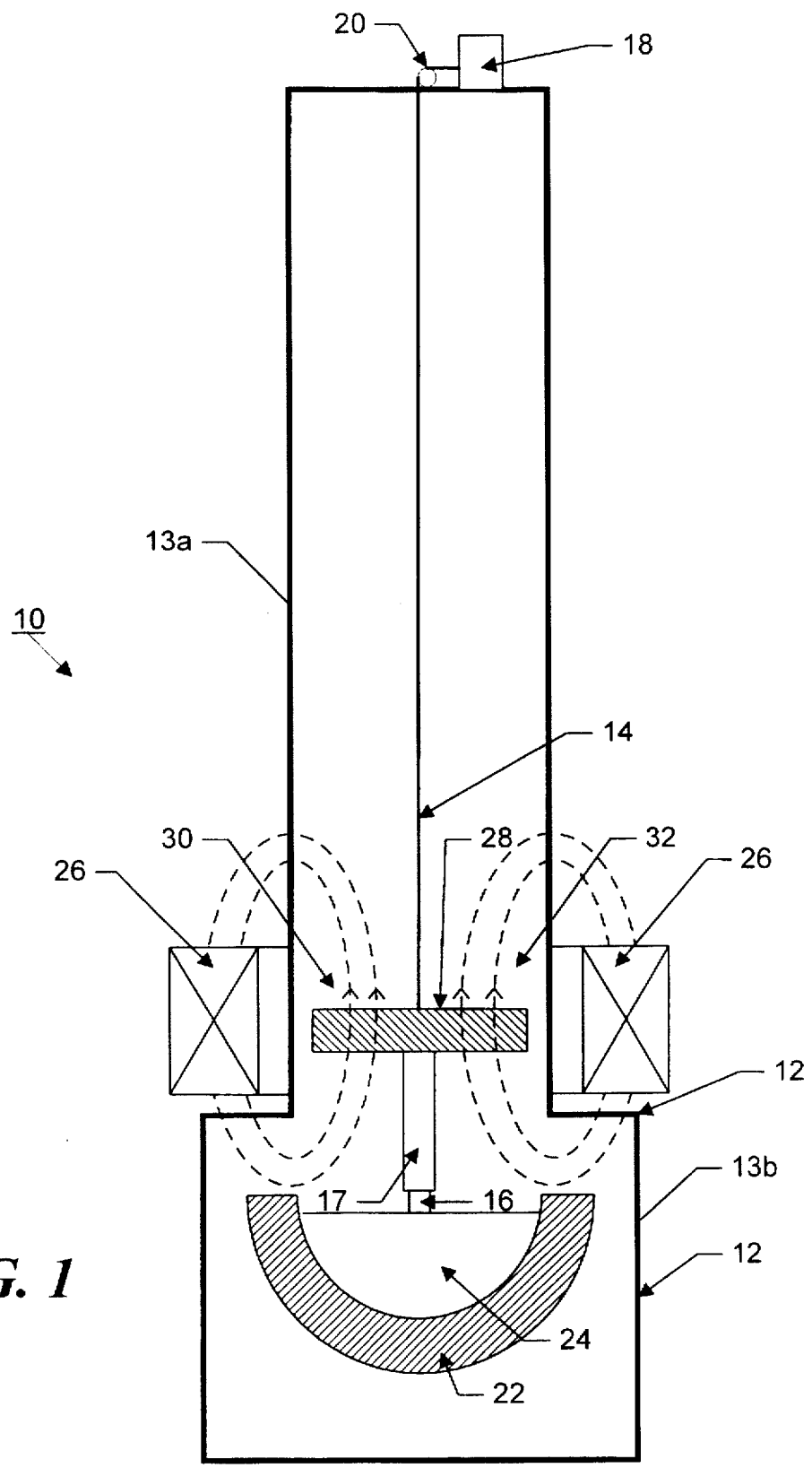
FIG. 1 is a schematic partial cross-sectional drawing of a portion of a Czochralski crystal puller utilizing a preferred embodiment of the present invention.

FIG. 1 shows a simplified schematic diagram of a preferred embodiment of the invention. FIG. 1 illustrates the parts of a Czochralski crystal puller which are pertinent to the invention. There are other well-known parts, but these have been omitted for clarity. In addition, the drawing is not to scale, but shows the crystal puller in the initial or starting position with the seed crystal 16 in its lowest position.

Specifically, an improved Czochralski crystal pulling device 10 is shown having a high-temperature vacuum chamber 12, and a wire cable 14 partially within the chamber 12 for dynamically suspending a silicon seed crystal 16 (which may be connected to the cable 14 by a seed chuck 17). The apparatus is generally symmetrical about cable 14 which defines an axis for the device.

A motor 18 is connected to one end of the cable for longitudinally moving the cable 14. A pulley 20 may also be included to guide the cable 14 above the chamber 12. The motor 18 and the pulley 20 are conventionally mounted on a turntable (not shown) which rotates about the device axis in order to rotate cable 14 and the attached seed crystal 16. Operation of the motor 18 pulls the ingot which grows from the seed crystal upwards into an upper or "receiving" part 13b of the chamber 12 from a lower part or "growth chamber" 13a.

Initially, longitudinal movement of the cable 14 moves the seed 16 into communication with a predetermined charge of silicon 24 contained in a high-temperature crucible 22. Inductive or resistive heating coils (not shown) are used in a well-known fashion to melt the silicon 24 in crucible 22. In a conventional fashion, crucible 22 may also be rotated about the axis to more "evenly" grow a single silicon crystal. Crucible 22 may also be raised in a direction parallel to the axis to maintain the surface of the molten silicon at a constant height relative to the seed crystal as silicon is removed from the crucible 22 due to crystal growth. The mechanisms for rotating and raising the crucible 22 are not shown since they are not essential to the invention and may be any devices known in the art that can effectuate such purposes.

The invention improves on the above-described Czochralski crystal pulling device by the addition of a magnetic field generator 26. Field generator 26 may be positioned either inside or outside the chamber 12, but the preferred position is shown in FIG. 1 on the outside so that the generator 26 is not subject to the harsh environment inside the chamber 12. The field generator 26 is preferably designed to produce an axial magnetic field as schematically illustrated by arrows 30. Any magnetic field that provides a damping force with adequate magnitude, however, will suffice. Accordingly, the invention is not intended to be limited to any specific type of magnetic field generator 26, or any specific type of magnetic field produced by the field generator 26. Any magnetic field generator known in the art may be used that will provide the desired damping force. Such field generators 26 include, for example, permanent magnets or electromagnets and the field may be axial or shaped to provide damping in a desired direction.

An electrically-conductive plate 28 is mounted near the seed crystal 16 on the cable 14 or on the seed chuck 17. The conductive plate 28 may have a plurality of holes to facilitate the circulation of a cooling gas (such as argon) that may be circulating within the device. It is known in the art that an eddy current is induced within a conductor when that conductor moves within a magnetic field. In the case of an axial magnetic field such as field 30, when the plate 28 moves perpendicular to the device axis, the induced eddy current will circulate around the device axis and its magnitude is dependent on the speed of the movement. The induced eddy current then interacts with the magnetic field to resist further movement of the conductor within the magnetic field. The force generated by the interaction of the eddy current and the magnetic field is at right angles to both the field and the eddy current or perpendicular to the device axis. It therefore follows that when the conductive plate 28 moves within the generated magnetic field 30, its resultant eddy current will resist further movement of the conductor 28 in a direction perpendicular to the device axis. Accordingly, orbital motion of the plate 28, and consequently the seed 16, will be subject to an opposing or damping force which substantially reduces or eliminates such motion. The conductor 28 should therefore orbit thus maintaining the integrity of the silicon crystal growth process.

The previously mentioned, longitudinal and rotational movement of the seed 16 (and attached seed chuck 17 and conductive plate 28), which are both required by the process, will also generate eddy currents in the conductive plate 28. The resultant magnetic force generated by the longitudinal movement is negligible, however, because the longitudinal movement is relatively slow. Since the noted rotational motion is at a constant speed, the resultant opposing rotational force is constant and also can be effectively eliminated by the torque in the wire cable 14. In an alternative embodiment, the conductive plate 28 is comprised of circular rings laminated with circular insulators to effectively eliminate any opposing rotational or longitudinal forces may be created by the longitudinal and rotational movement. Alternatively, the laminations may be arranged to produce damping forces in desired directions. Any lamination process known in the art will suffice.

It is essential that the conductive plate 28 be made from a material that will not weaken or otherwise degrade when subjected to the high temperatures within the chamber 12. Any known material, or combination of materials, that performs the appropriate function without degrading will suffice. In a preferred embodiment, the plate 28 is comprised of tungsten and/or molybdenum. The plate 28 may also be any appropriate shape and size. Since the receiving chamber 13 of a Czochralski crystal pulling device typically is cylindrical, it is preferred that the conductive plate 28 be shaped as a circular disk with a diameter such that the outer periphery of the disk extends close to the chamber walls. For example, the conductive plate 28 might be a disk having a maximum diameter of two inches less than the diameter of the receiving chamber 13, and a thickness of one to three inches.

Figure 2:
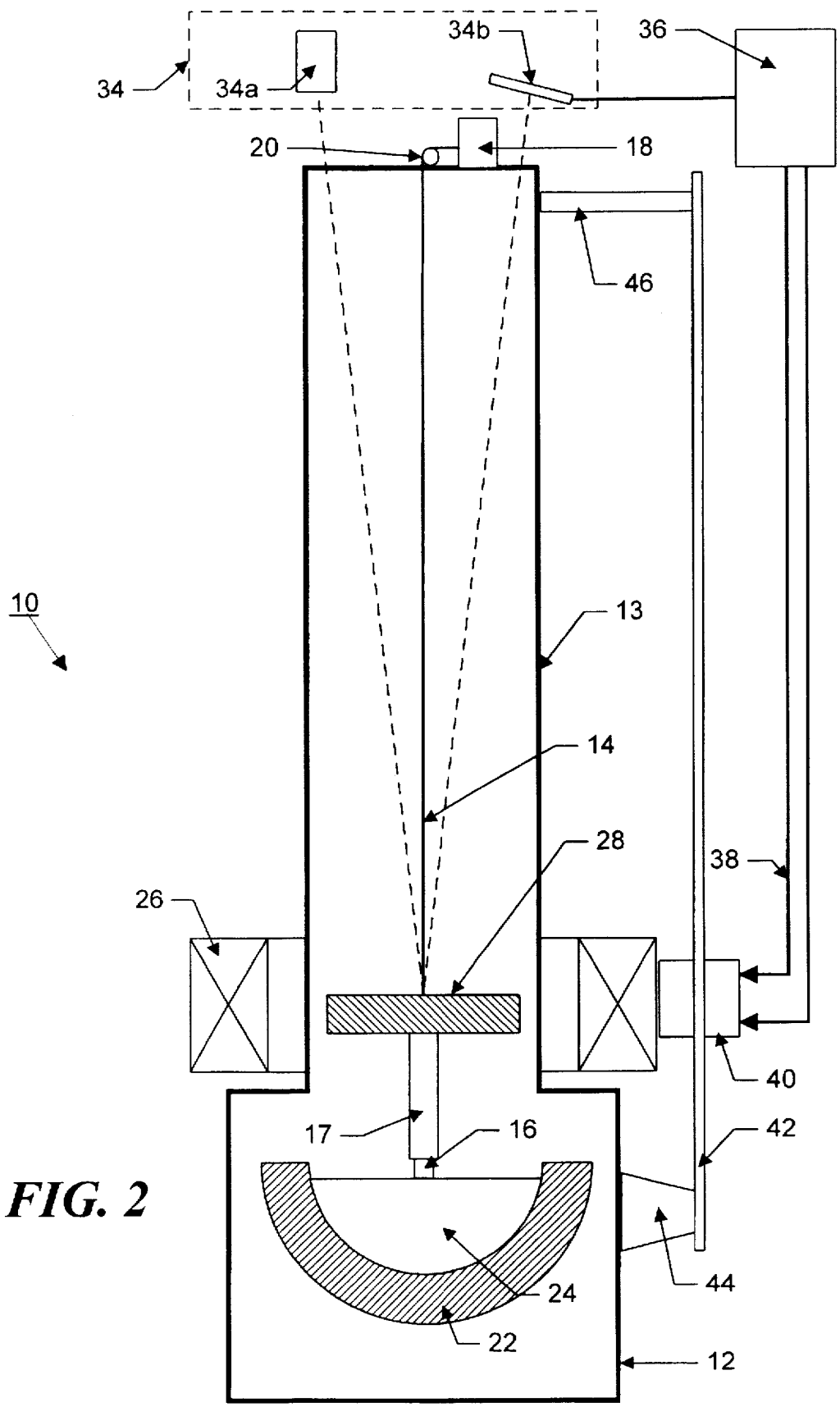
FIG. 2 is a schematic drawing of an alternative embodiment of the present invention in which the magnetic field generator is moved along with the movement of the conductive plate.

In order for the damping mechanism to work, the conductive plate 28 must remain within a magnetic field during the entire crystal growing process as the plate moves from the position shown in FIG. 1 to the top of the chamber. One way to insure that the plate remains in the field is to construct a field generator which generates a field along the entire length of the receiving chamber 13. This could be done, for example, by mounting magnets along the entire length of the receiving chamber wall. However, FIG. 2 shows an alternative embodiment of the invention which utilizes a magnetic field generator which generates a local magnetic field, but moves the generator along with the movement of the plate 28. The mechanism for moving the field generator 26 includes a motion sensor 34 that senses the longitudinal movement of the conductive plate 28 along the device axis. The output of the motion sensor 34 is applied to a controller 36 which, in turn, controls a motor 40 that moves magnetic field generator 26 in response to the longitudinal movement of the conductor 28. With this system, motor 40 moves the field generator 26 a corresponding longitudinal distance in the same direction as the plate 28. Therefore, plate 28 remains in the strongest part of the magnetic field, thus maintaining the damping without requiring magnets to be mounted along the entire length of the chamber.

Any sensor apparatus known in the art that accurately senses linear motion will suffice. For example, a laser 34a with an accompanying laser photodetector array 34b could be used. The laser generates a light spot which is reflected from a small reflective portion of the plate 28. The reflected light travels to the detector array 34b. As the plate moves along the device axis, the angle of incidence and, consequently, the angle of reflection of the spot on the plate 28 changes causing the position of the reflected spot on the detector array 34b to change. This position change is applied to the controller 36, which, in turn, drives motor 40, via leads 38. The controller 36 is a conventional motor controller and will not be described in detail herein. Alternatively, an encoder or other processor device (not shown) may be disposed within the pull head (not shown), that continually monitors the position, weight, and size of the crystal 16.

Similarly, the motor 40 which moves the field generator 26 may be a stepper motor, a screw-drive motor or any other type of motor. The motor 40 utilizes track 42 to move the field generator 26 along with plate 28. Track 42 is mounted on the outside of the receiving chamber 13 by means of supports 44 and 46.

Figure 3:
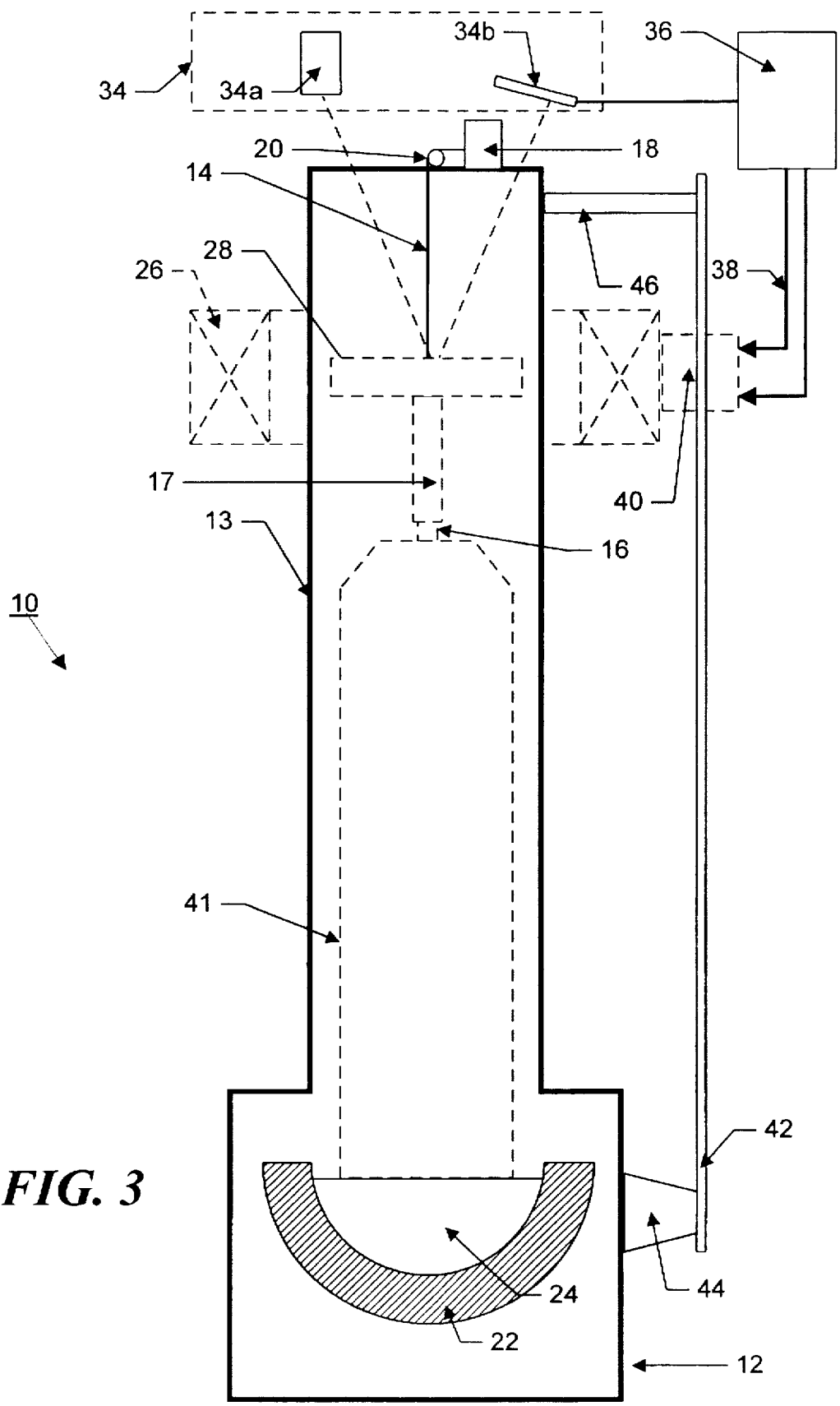
FIG. 3 is a schematic drawing of the alternative embodiment shown in FIG. 2 in which conductive plate is shown near its upper position illustrating the repositioning of the magnetic field generator.

The position of the plate 28 and the field generator 26 are shown in dotted outline in FIG. 3. The dotted position illustrates the mechanism when it is nearing the end of its travel. The crystal ingot 41 is also illustrated in dotted lines.

Figure 4:
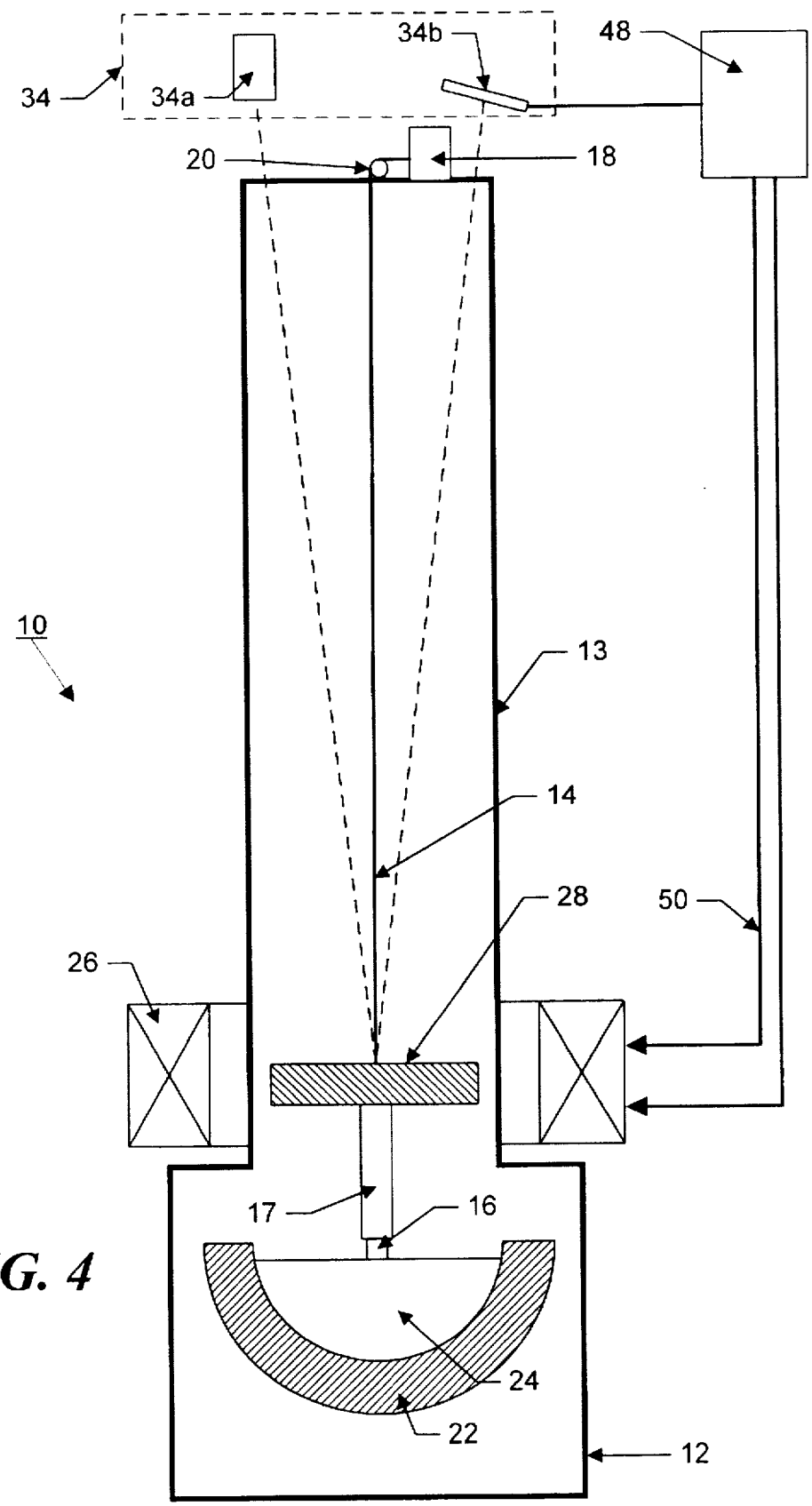
FIG. 4 is a schematic drawing of another alternative embodiment of the present invention using a motion sensor to control the magnetic field strength.

FIG. 4 shows another alternative embodiment of the present invention which uses an electromagnet for the magnetic field generator 26. This embodiment includes a motion sensor 34 to sense the orbital motion of the plate 28, and controlling hardware and/or software (shown generally at 48 and referred to herein as "the current controller") for controlling the current flow through the windings of the electromagnet 26, via leads 50. In particular, the controller 48 controls the current through the electromagnet in a manner such that the magnetic field strength in the vicinity of the plate 28 is related to the amplitude of any orbital oscillation. Thus, when the plate oscillation amplitude is small, the current applied to the magnet windings is also small resulting in a damping force, which is weak, but sufficient to adequately damp the oscillatory motion. Similarly, when a large amplitude oscillatory motion is sensed (which requires a larger damping force to control) the controller applies a larger current to the electromagnet windings which, in turn, generate a larger damping force.

Therefore, the embodiment saves power and reduces heat buildup in the field generator 26 by causing the controller to provide current only on an "as needed" basis. Accordingly, the inventive embodiment operates more efficiently than an arrangement in which a constant current is supplied.

The motion sensor 34 may be the same or similar to that illustrated in FIG. 2. For example, a laser 34a with an accompanying laser photodetector array 34b could be used. The laser generates a light spot which is reflected from a small reflective portion of the plate 28. The reflected light travels to the detector array 34b. As the plate orbits the device axis, the reflection angle on of the spot on the plate changes causing the position of the reflected spot on the detector array to move in synchronism with the plate motion. This spot motion is detected and is applied to the controller 48.

Figure 5A:
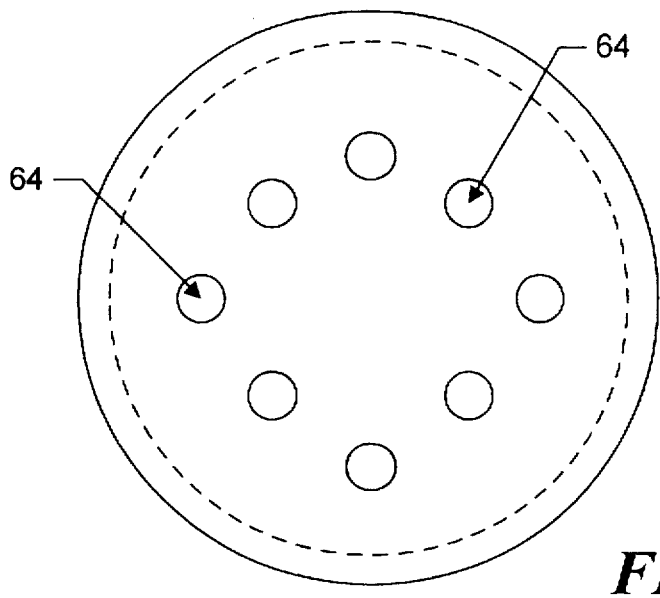
FIGS. 5A and 5B are a top view and side view of another embodiment of the present invention which shows an alternative construction of the conductive plate.
Figure 5B:
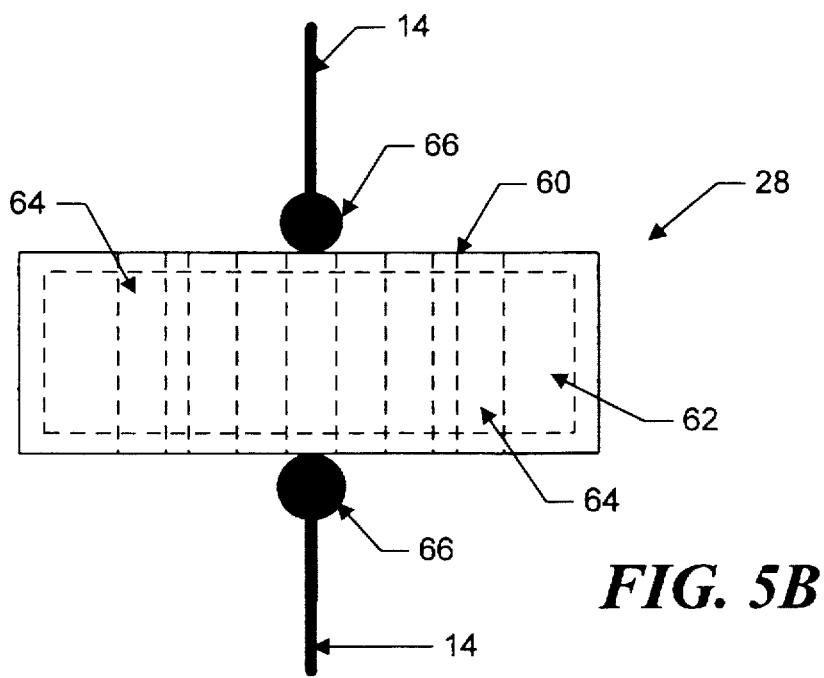

FIGS. 5A and 5B show an alternative embodiment of the invention in which the conductive plate 28 is fabricated as a composite structure which has an external, heat-resistant outer shell 60, and an internal, highly conductive core 62 entirely contained within the outer shell 60. The shell 60 is made from a material (such as, for example, molybdenum and/or tungsten) with a high melting point that is capable of withstanding the high temperatures existent within the chamber. On the other hand, the highly-conductive core 62 minimizes electrical resistance and maximizes the eddy current which develops when the composite structure moves in the magnetic field, in turn, maximizing the damping force. The conductive plate 28 also has several holes 64 that pass through the plate to allow argon cooling gas to pass through the plate along the length of the growing crystal to cool the crystal in a conventional fashion. Although not shown in detail, the shell 60 also coats the walls of the holes 64 to protect the core 62.

In addition, in order to preserve the integrity of shell 60, the plate 28 is fastened to cable 14 by means of two ball and socket joints. In particular, the ends of cable 14 are attached to two balls 66 which fit into two sockets 68. Cable 14 passes though holes 69 so that balls 66 are in the interior of sockets 66. Sockets 66 are then attached by suitable means, such as welding, to the shell 60.

Figure 6:
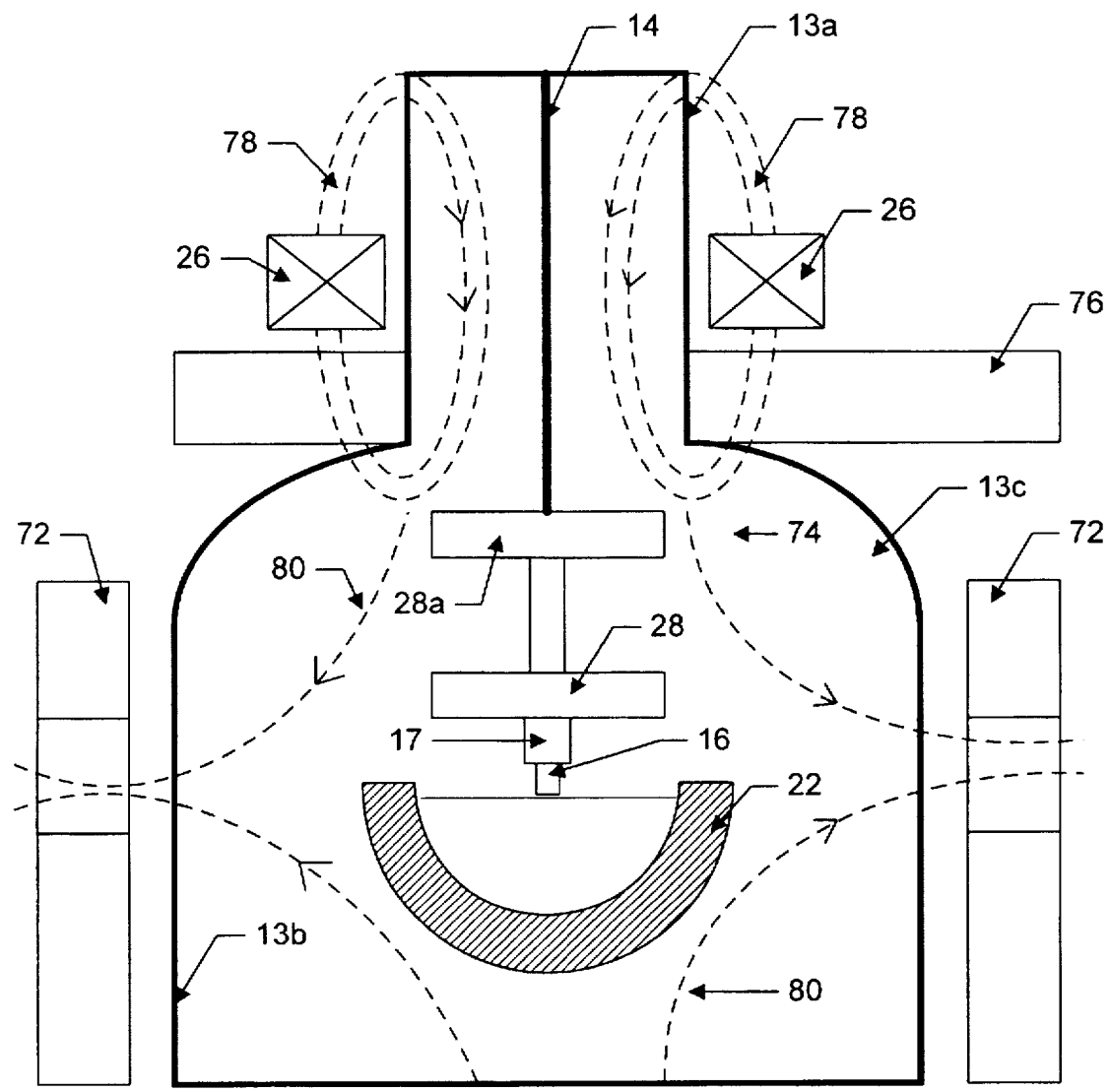
FIG. 6 is a schematic drawing of another alternative embodiment of the present invention showing seed crystal in lowered position and which utilizes at least two conductive plates to insure that damping occurs at all points in the crystal growth process.

FIG. 6 shows an alternative embodiment of the invention which is useful in crystal pullers where the receiving chamber 13a is separated from the growth chamber 13b by a transition section 13c and an isolation valve 76. Since the magnetic field generator 26 only generates a local field (indicated schematically as dotted lines 78), the field strength is sufficient to produce acceptable damping only when the conductive plate 28 is located in the vicinity of the generator 26. In this case, due to the distance between the magnetic field generator 26 and the conductive plate 28 imposed by the transition section 13c and the valve 76, the damping force magnitude may not be sufficient to prevent oscillation. Fortunately, when the crystal is at its lowest position as shown in FIG. 6, a magnetic field (illustrated by dotted lines 80) generated by conventional MCZ magnets 72 has sufficient magnitude to produce acceptable damping forces in plate 28. The MCZ magnets 72 are used to electromagnetically damp ripples in the molten silicon by inducing an eddy current in the molten silicon.

However, if the height of the transition section 13c is substantial, then at an intermediate location such as location 74, neither the field 78 generated by the magnet field generator 26 nor the field 80 generated by the MCZ magnets 72 may have sufficient strength to generate acceptable damping forces in plate 28.

Accordingly, in the alternative embodiment of the invention shown in FIG. 6, a second conductive disk 28a is connected to the cable 14 at a predetermined distance from the first disk 28. The predetermined distance may be approximately equal to the distance between the magnetic field generator 26 and the MCZ magnets 72. Accordingly, at least one of the conductive disks 28 or 28a will be always be within a field having a sufficient field strength to ensure that the magnitude of damping force is acceptable. For example, as shown in FIG. 6, when the seed crystal is at its lowest level, conductive plate 28 is within the field 80 of MCZ magnets 72 having sufficient field strength to produce damping of an acceptable magnitude.

Figure 7:
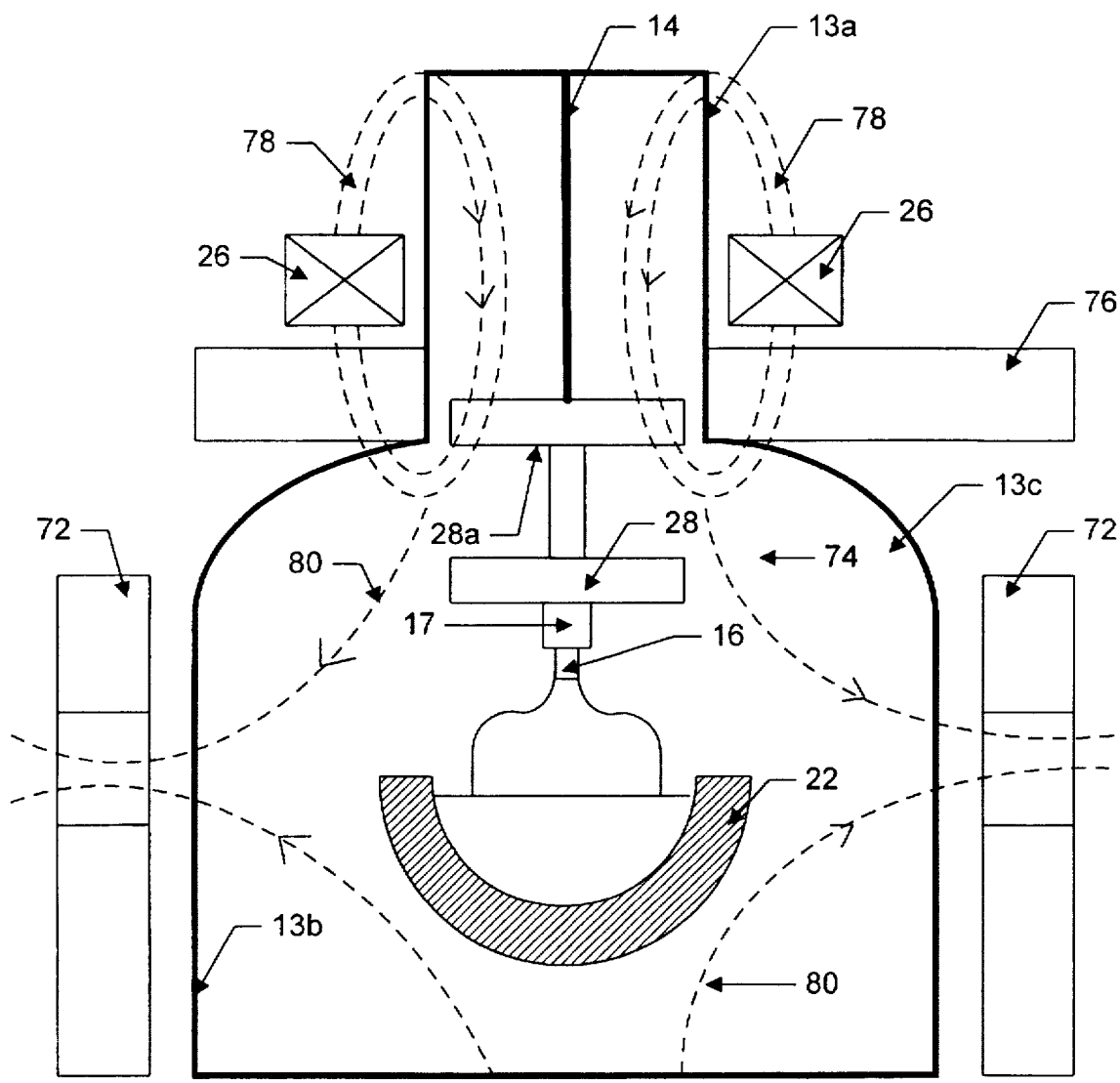
FIG. 7 is a schematic drawing of another alternative embodiment of the present invention showing seed crystal in a partially raised position and which utilizes the dual conductive plate arrangement shown in FIG. 6.

Alternatively, when the seed crystal is raised as shown in FIG. 7, conductive plate 28 moves a sufficient distance away from MCZ magnets 72 that the field strength drops to the point that the damping force is too low to be acceptable. However, as the damping force produced by conductive plate 28 falls, conductive plate 28a moves into a position of higher field strength in the field 78 generated by magnetic field generator 26. Thus, the damping produced by plate 28a together with that produced by plate 28 is acceptable. By suitably positioning plates 28 and 28a, the damping force can be maintained along the entire length of travel.

In other similar alternative embodiments, any number of conductive disks may be connected to the cable 14 to ensure that at least one is within a magnetic field having sufficient field strength to produce adequate damping.

A single silicon crystal may therefore be produced by the improved Czochralski crystal pulling device 10 by dynamically suspending a seed crystal 16 within the vacuum chamber 12 on the cable 14, and immersing the seed 16 in the molten silicon 24. In conformance with conventional processes, the seed is also rotating. An electrically-conductive plate 28 is mechanically connected to the seed crystal. A magnetic field may then be produced by a source external to the chamber 12. When the plate moves, an eddy current is generated in the plate by the field, which eddy current tends to oppose movement of the plate. Any tendency of the seed crystal or the resulting ingot to orbit about the device axis within the chamber 12 is reduced or eliminated.

The invention has been tested with field generator 26 comprising a plurality of neodymium-iron-boron permanent button magnets pressed into an aluminum ring, which was positioned about a vacuum chamber of a Czochralski crystal puller. The magnets had their magnetic axis aligned with the device axis and produced an axial magnetic field within the chamber 12. Such embodiment experimentally reduced the maximum amplitude of the orbiting seed crystal 16 from an amplitude of 0.45 inches to virtually 0.00 inches in 5.5 seconds. Conversely, the orbiting amplitude of the seed 16 did not change significantly in 120 seconds when the magnetic field was removed.

While the invention has been shown and described above with respect to various preferred embodiments, it will apparent that the foregoing and other changes of the form and detail may be made therein by one skilled in the art without departing from the spirit and scope of the invention.

What is claimed is:

1. An apparatus for damping orbital oscillation of a ingot suspended on a cable in a Czochralski crystal growing device, the apparatus comprising:

a first magnetic field generator for generating a first magnetic field;

a conductor for generating a second magnetic field;

means for mechanically connecting the conductor to the ingot;

the second magnetic field being generated in the vicinity of the first magnetic field so that the first and second magnetic fields interact to oppose the orbital oscillation.

2. The apparatus as defined in claim 1 wherein the first magnetic field generator generates a magnetic field having a direction parallel to the cable.

3. The apparatus as defined in claim 1 wherein the Czochralski crystal growing device includes a closed vacuum chamber and the ingot is positioned inside the vacuum chamber and the first magnetic field generator is positioned outside the vacuum chamber.

4. The apparatus as defined in claim 1 wherein the conductor comprises an electrically-conductive plate positioned in the first magnetic field in such a manner that an eddy current is generated in the plate when the plate moves.

5. The apparatus as defined by claim 1 further including a third magnetic field generator mechanically connected to the cable.

6. An apparatus for damping orbital oscillation of a ingot suspended on a cable in a Czochralski crystal growing device, the apparatus comprising:

an electrically-conductive plate mechanically connected to the ingot; and a magnetic field generator for generating a magnetic field in the vicinity of the plate.

7. The apparatus as defined in claim 6 wherein the magnetic field generator generates a magnetic field having a direction parallel to the cable.

8. The apparatus as defined in claim 6 wherein the Czochralski crystal growing device includes a closed vacuum chamber and the ingot is positioned inside the vacuum chamber and the magnetic field generator is positioned outside the vacuum chamber.

9. The apparatus as defined in claim 6 wherein the plate is positioned in the magnetic field in such a manner that an eddy current is generated in the plate when the plate moves.

10. The apparatus as defined in claim 6 further comprising means for moving the magnetic field generator as the plate moves so that the plate always remains in the magnetic field.

11. The apparatus as defined by claim 6 wherein the magnetic field generator includes a permanent magnet.

12. The apparatus as defined by claim 6 wherein the magnetic field generator includes an electromagnet which is responsive to a current with a magnitude for generating a magnetic field having a strength which is dependent on the current magnitude.

13. The apparatus as defined in claim 12 wherein the ingot and the plate tend to move in an orbital motion with an amplitude and wherein the apparatus further comprises means responsive to the orbital motion amplitude for adjusting the current magnitude.

14. The apparatus as defined by claim 13 further including a motion sensor for sensing the amplitude of the orbital motion.

15. The apparatus as defined by claim 14 wherein the motion sensor includes a laser and a laser detector.

16. The apparatus as defined by claim 13 wherein the current adjusting means comprises a current controller for controlling the current through the electromagnet, the current controller being controlled by the motion sensor.

17. The apparatus as defined by claim 6 wherein the chamber is a cylindrically shaped vacuum chamber having a chamber diameter and wherein the conductive plate is a circular disk having a disk diameter substantially less than the chamber diameter.

18. The apparatus as defined by claim 6 wherein the conductive plate is fabricated from a metal with a melting temperature higher than the melting temperature of silicon.

19. The apparatus as defined by claim 6 wherein the electrically-conductive plate is comprised of:

an outer container having a higher melting temperature than the melting temperature of silicon; and an inner conductor within the container having a high conductivity.

20. The apparatus as defined by claim 6 wherein the electrically-conductive plate is comprised on alternating conductive plates and insulating plates.

21. The apparatus as defined by claim 20 wherein the alternating conductive and insulating plates are circular.

22. Czochralski silicon crystal growing apparatus comprising:

a closed vacuum chamber;

a crucible in the vacuum chamber for holding molten silicon;

a cable for dynamically suspending a silicon ingot over the crucible;

an electrically-conductive plate mechanically connected to the ingot; and a magnetic field generator positioned external to the vacuum chamber and generating a magnetic field in the vicinity of the plate.

23. Czochralski crystal growing apparatus as defined by claim 22 wherein the magnetic field generator is an electromagnet having windings responsive to a current for generating the magnetic field.

24. Czochralski crystal growing apparatus as defined by claim 23 wherein the magnet generates a local field and wherein the apparatus further comprises means for moving the magnetic field generator to keep the plate within the local field.

25. Czochralski crystal growing apparatus as defined by claim 24 wherein the ingot and the plate tend to move in an orbital motion and wherein the apparatus further comprises means responsive to the orbital motion for controlling a magnitude of current through the electromagnet windings.

26. Czochralski crystal growing apparatus as defined in claim 25 wherein the current controlling means increases the current magnitude when the orbital motion increases and decreases the current magnitude when the orbital motion decreases.

* * * * *